(12) United States Patent
Fukami et al.

(10) Patent No.: US 11,549,515 B2
(45) Date of Patent: Jan. 10, 2023

(54) VACUUM PUMP, TEMPERATURE ADJUSTMENT CONTROLLER USED FOR VACUUM PUMP, INSPECTION TOOL, AND METHOD OF DIAGNOSING TEMPERATURE-ADJUSTMENT FUNCTION UNIT

(71) Applicant: Edwards Japan Limited, Chiba (JP)

(72) Inventors: Hideo Fukami, Chiba (JP); Masatoshi Ishibashi, Chiba (JP)

(73) Assignee: Edwards Japan Limited, Chiba (JP)

( * ) Notice: Subject to any disclaimer, the term of this patent is extended or adjusted under 35 U.S.C. 154(b) by 403 days.

(21) Appl. No.: 16/629,471

(22) PCT Filed: Jul. 6, 2018

(86) PCT No.: PCT/JP2018/025668
§ 371 (c)(1),
(2) Date: Jan. 8, 2020

(87) PCT Pub. No.: WO2019/013118
PCT Pub. Date: Jan. 17, 2019

(65) Prior Publication Data
US 2021/0018012 A1    Jan. 21, 2021

(30) Foreign Application Priority Data

Jul. 14, 2017  (JP) ............................. JP2017-138323
Nov. 1, 2017   (JP) ............................. JP2017-211992

(51) Int. Cl.
*G01R 31/52*     (2020.01)
*F04D 27/00*     (2006.01)
(Continued)

(52) U.S. Cl.
CPC ......... *F04D 27/007* (2013.01); *F04D 19/042* (2013.01); *F04D 19/048* (2013.01);
(Continued)

(58) Field of Classification Search
CPC ....... G01R 31/54; G01R 31/52; F04D 19/042; F04D 19/048; F04B 51/00
See application file for complete search history.

(56) References Cited

U.S. PATENT DOCUMENTS 6,949,853 B2 * 9/2005 Kawashima ........ F16C 32/0442
310/90.5
7,091,641 B2 * 8/2006 Kawashima ........ F16C 32/0457
310/90.5
(Continued)

FOREIGN PATENT DOCUMENTS

CN    204313635 U  *  5/2015
DE      19833040 B4 *  9/2008  ........... F04D 19/048
(Continued)

OTHER PUBLICATIONS

PCT International Search Report dated Sep. 4, 2018 for corresponding PCT Application No. PCT/JP2018/025668.
(Continued)

*Primary Examiner* — Patrick Assouad
*Assistant Examiner* — Demetrius R Pretlow
(74) *Attorney, Agent, or Firm* — Theodore M. Magee; Westman, Champlin & Koehler, P.A.

(57) ABSTRACT

A vacuum pump includes a control unit that monitors and controls a motor and a magnetic bearing, each being stored in a pump body. A temperature-adjustment function unit measures a temperature of the pump body by at least one temperature sensor disposed in the pump body and controls at least one heater or solenoid controlled valve based on the temperature. The temperature-adjustment function unit includes a first terminal capable of connecting or disconnecting the temperature sensor and a second terminal capable of connecting or disconnecting one of the heater and the solenoid controlled valve. A self-diagnosis unit capable of conducting a self-diagnosis of whether an input signal to
(Continued)

the first terminal has been normally inputted or whether the signal has been normally outputted from the second terminal.

8 Claims, 11 Drawing Sheets

(51) Int. Cl.
*F04D 19/04* (2006.01)
*G01K 1/143* (2021.01)
*G01R 31/54* (2020.01)

(52) U.S. Cl.
CPC .............. *G01K 1/143* (2013.01); *G01R 31/52* (2020.01); *G01R 31/54* (2020.01); *G01K 2217/00* (2013.01)

(56) References Cited

U.S. PATENT DOCUMENTS

| | | | | |
|---|---|---|---|---|
| 7,245,097 | B2 * | 7/2007 | Someya | F04D 27/0261 318/400.11 |
| 2001/0043868 | A1 * | 11/2001 | Kubo | F04D 29/584 417/423.4 |
| 2012/0143390 | A1 * | 6/2012 | Miwata | F04D 19/042 700/300 |
| 2013/0243583 | A1 * | 9/2013 | Kawanishi | F04D 29/526 415/191 |
| 2015/0086328 | A1 * | 3/2015 | Tsutsui | F04D 27/02 415/47 |
| 2015/0219116 | A1 * | 8/2015 | Tsutsui | F04D 29/584 415/175 |
| 2015/0226229 | A1 * | 8/2015 | Tsutsui | F04D 29/5853 415/47 |
| 2016/0025096 | A1 * | 1/2016 | Shi | F04D 29/053 417/423.1 |
| 2016/0160877 | A1 * | 6/2016 | Sakaguchi | F04D 19/04 415/177 |
| 2017/0306967 | A1 * | 10/2017 | Kozaki | F04D 29/058 |
| 2018/0291926 | A1 * | 10/2018 | Moriyama | F04D 29/058 |

FOREIGN PATENT DOCUMENTS

| | | | | |
|---|---|---|---|---|
| JP | S6213796 | A | | 1/1987 |
| JP | S6361782 | A | | 3/1988 |
| JP | 0855517 | A2 * | | 7/1998 |
| JP | 2000064964 | A | | 3/2000 |
| JP | 2002070788 | A | * | 3/2002 |
| JP | 2003148379 | A | * | 5/2003 |
| JP | 2003278692 | A | | 10/2003 |
| JP | 2004301322 | A | | 10/2004 |
| JP | 2006017089 | A | * | 1/2006 |
| JP | 2006037739 | A | * | 2/2006 |
| JP | 3121358 | U | * | 5/2006 |
| JP | 2008184904 | A | | 8/2008 |
| JP | 2009041458 | A | | 2/2009 |
| JP | 2009174333 | A | * | 8/2009 ........... F04D 19/042 |
| JP | 2011169164 | A | * | 9/2011 |
| JP | 2011226377 | A | | 11/2011 |
| JP | 2016156339 | A | * | 9/2016 |
| JP | 2016160917 | A | | 9/2016 |
| JP | 2017089462 | A | | 5/2017 |
| WO | WO-2005116448 | A1 * | | 12/2005 ........... F04D 19/042 |
| WO | WO-2008062598 | A1 * | | 5/2008 ........... F04D 19/042 |
| WO | 2011021428 | A1 | | 2/2011 |
| WO | WO-2014196248 | A1 * | | 12/2014 .............. F04B 37/14 |

OTHER PUBLICATIONS

PCT International Written Opinion dated Sep. 4, 2018 for corresponding PCT Application No. PCT/JP2018/025668.

* cited by examiner

VACUUM PUMP, TEMPERATURE ADJUSTMENT CONTROLLER USED FOR VACUUM PUMP, INSPECTION TOOL, AND METHOD OF DIAGNOSING TEMPERATURE-ADJUSTMENT FUNCTION UNIT

CROSS-REFERENCE OF RELATED APPLICATION

This application is a Section 371 National Stage Application of International Application No. PCT/JP2018/025668, filed Jul. 6, 2018, which is incorporated by reference in its entirety and published as WO 2019/013118 A1 on Jan. 17, 2019 and which claims priority of Japanese Application No. 2017-138323, filed Jul. 14, 2017 and Japanese Application No. 2017-211992, filed Nov. 1, 2017.

BACKGROUND OF THE INVENTION

The present invention relates to a vacuum pump, a temperature adjustment controller used for the vacuum pump, an inspection tool, and a method of diagnosing a temperature-adjustment function unit, and particularly relates to a vacuum pump, a temperature adjustment controller used for the vacuum pump, an inspection tool, and a method of diagnosing a temperature-adjustment function unit, by which the need for a large inspection apparatus can be eliminated, a temperature adjustment function can be self-diagnosed with a simple device, and a general-purpose inspection can be performed.

In response to recent development of electronics, demand for semiconductors, e.g., memory and integrated circuits has grown sharply.

Such a semiconductor is manufactured by, for example, doping a semiconductor substrate of extremely high purity with an impurity so as to exhibit electrical properties or forming a fine circuit on a semiconductor substrate by etching.

It is necessary to perform these operations in a high-vacuum chamber in order to avoid the influence of dust or the like in the air. For evacuation of such a chamber, a vacuum pump is typically used. In particular, a turbo molecular pump, a kind of vacuum pump, is frequently used because of a small amount of residual gas and ease of maintenance.

A process of manufacturing semiconductors includes many steps of actions of process gas on semiconductor substrates. A turbo molecular pump is used for the exhaust of process gas from a chamber as well as the evacuation of the chamber.

Process gas at a high temperature may be introduced into the chamber in order to improve reactivity. Such process gas is cooled to a certain temperature during evacuation, so that the gas may be solidified so as to precipitate a product in an exhaust system. Moreover, such process gas may be solidified at a low temperature in a turbo molecular pump so as to be deposited in the turbo molecular pump.

A buildup of a deposit of process gas in the turbo molecular pump may narrow a pump channel and deteriorate the performance of the turbo molecular pump.

In order to solve the problem in the related art, a heater and an annular water-cooled tube are wound around, for example, the base part of a turbo molecular pump, a temperature sensor (e.g., a thermistor) is embedded in, for example, in the base part, and heat from the heater and cooling through the water-cooled tube are controlled (temperature management system, hereinafter will be referred to as TMS) so as to keep the temperature of the base part at a certain high temperature (set temperature) based on a signal of the temperature sensor (See WO 2011/021428 and Japanese Patent Application Publication No. 2003-278692).

A product is unlikely to be deposited at a high set temperature in the TMS. Thus, it is desirable to maximize the set temperature.

When the base part has a high temperature, an electronic circuit provided in the body of the turbo molecular pump may exceed a critical temperature if an exhaust load fluctuates or an ambient temperature changes to a high temperature. This may break a storage means including semiconductor memory. At this point, the semiconductor memory may be damaged and maintenance information data including a pump start time and an error log may be deleted.

If the maintenance information data is deleted, the timing of a maintenance check and the timing of replacement of the turbo molecular pump cannot be determined. This seriously interferes with the operations of the turbo molecular pump. Thus, cooling is performed through the water-cooled tube at a temperature higher than a predetermined temperature.

FIG. 11 shows an example of TMS control.

In this example, the temperature of the base part is measured by a temperature sensor (corresponding to a TMS temperature sensor, which will be described later) and a heating instruction is transmitted to the heater or a solenoid controlled valve is opened and closed to control a water flow into the water-cooled tube such that a measured temperature is not higher than a preset permissible temperature of the base part. A target set temperature is, for example, 60° C.

Specifically, in FIG. 11, a controller turns on the heater in an initial step at the start of an operation and continues applying heat and turns off the heater when a temperature measured by the temperature sensor exceeds 60° C. During this period, the solenoid controlled valve is kept closed and thus the base part is heated by the heater.

Even after the heater is turned off at 60° C., the temperature of the base part does not rapidly fall but draws an overshoot curve based on a heat capacity. Thereafter, when a measured temperature exceeds 63° C., the solenoid controlled valve is opened to supply water from the water-cooled tube. When the temperature of the base part falls to 60° C. or lower, the solenoid controlled valve is closed. Thereafter, when the temperature of the base part falls to 58° C. or lower, the heater is turned on again.

In the control example of FIG. 11, the single temperature sensor controls the single heater and the single solenoid controlled valve. As the capacity of the pump increases, more temperature sensors, heaters, and solenoid controlled valves are provided. The heater is turned on and off and the solenoid controlled valve is opened and closed at varying temperatures. A threshold temperature is set in consideration of hysteresis and a complicated logic.

The discussion above is merely provided for general background information and is not intended to be used as an aid in determining the scope of the claimed subject matter. The claimed subject matter is not limited to implementations that solve any or all disadvantages noted in the background.

SUMMARY

In order to inspect whether TMS control, in which complicated time-series operations are performed in consideration of hysteresis, is normally performed or not in the related art, an inspection is conducted by a dedicated inspection apparatus connected to a controller. The inspection apparatus includes an inspection tool, an I/O substrate, and a personal computer. Application software or the like is configured for an OS used in a personal computer and thus an upgrade of the OS may cause the obsolescence of the inspection tool, the I/O substrate, and the application software.

If the pump increases in capacity and the number of sensors, the number of heaters to be controlled, and the number of solenoid controlled valves to be controlled increase, it may be necessary to develop and prepare another inspection apparatus.

Furthermore, the prepared inspection apparatus is not applied to all turbo molecular pumps. In the case of expensive inspection equipment, it may be difficult to regularly provide the inspection apparatus at service locations or the like.

Moreover, in response to a change in the number of sensors, the number of heaters, and the number of solenoid controlled valves according to a target pump, versatility is desirable not only for the inspection apparatus but also for the controller that monitors and controls the temperature of TMS.

In this case, however, it is assumed that a terminal (channel) may not be connected to the sensor, the heater, and the solenoid controlled valve depending on the operating environment and the throughput of the pump. An anomalous signal may be detected or erroneous control may be caused by noise or a short circuit that is caused by a broke wire and passes through the terminal.

The present invention has been devised in view of the conventional problems. It is an object of the present invention to provide a vacuum pump, a temperature adjustment controller used for the vacuum pump, an inspection tool, and a method of diagnosing a temperature-adjustment function unit, by which the need for a large inspection apparatus can be eliminated, a temperature adjustment function can be self-diagnosed with a simple device, and a general-purpose inspection can be performed.

Thus, the present invention (claim 1) is an invention of a vacuum pump, the vacuum pump including a temperature-adjustment function unit that measures a temperature of a pump body by at least one temperature sensor disposed in the pump body and controls at least one heater or solenoid controlled valve based on the temperature, the temperature-adjustment function unit including a first terminal capable of connecting or disconnecting the temperature sensor; and a second terminal capable of connecting or disconnecting one of the heater and the solenoid controlled valve, the vacuum pump further including a self-diagnosis unit capable of conducting a self-diagnosis of whether an input signal to the first terminal has been normally inputted or whether the signal has been normally outputted from the second terminal.

In addition to the temperature-adjustment function unit, the self-diagnosis unit is provided. The self-diagnosis unit can conduct a self-diagnosis of whether a measurement signal from the temperature sensor has been normally inputted or whether an output to the heater or the solenoid controlled valve is normally performed. The software section of the temperature-adjustment function unit is sufficiently inspected during development and thus is not inspected by the self-diagnosis unit. Thus, in an inspection of the self-diagnosis unit, only the input path formed by the temperature sensor and the output path of the heater and the solenoid controlled valve are inspected. A diagnosis program for the inspection is a simple program, thereby achieving an inexpensive configuration and eliminating the need for a large inspection tool, e.g., a personal computer in which a dedicated program is installed. This facilitates introduction at service locations.

Since a personal computer is not necessary for inspecting the self-diagnosis unit, an upgrade of an OS does not cause the obsolescence of application software unlike in the related art.

The present invention (claim 2) is an invention of a vacuum pump, the temperature-adjustment function unit including: temperature determining means that has a dummy first load connected instead of the temperature sensor to the first terminal and determines that the temperature sensor has reached a predetermined temperature value in simulation when a voltage applied to the first load has a preset voltage value; and output means that has a dummy second load connected instead of one of the heater and the solenoid controlled valve to the second terminal, and applies or stops a predetermined current to the second load based on a determination result of the temperature determining means, the preset voltage value is prepared for the turn-on and turn-off of the heater or the opening and closing of the solenoid controlled valve, and the output means is configured independently for each of the heater and the solenoid controlled valve.

The input path can be determined in simulation and the output path can be also determined in simulation, achieving an efficient inspection with ease.

The present invention (claim 3) is an invention of a vacuum pump, wherein an inspection is judged to be passed or not by determining the turn-on and turn-off of the heater or the opening and closing of the solenoid controlled valve on a time-series basis.

The turn-on and turn-off of the heater or the opening and closing of the solenoid controlled valve are determined on a time-series basis in the order of the actual operations of the temperature-adjustment function unit, thereby improving the accuracy of pass/fail judgment.

The present invention (claim 4) is an invention of a vacuum pump, further including output determining means for determining that one of the heater and the solenoid controlled valve has received a predetermined output in simulation when the predetermined current is applied to the output means.

The accuracy of pass/fail judgment is improved by confirming the predetermined current passing through the output means.

The present invention (claim 5) is an invention of a vacuum pump, wherein the first load is a resistor having resistance values for the turn-on and turn-off of the heater or a resistor having resistance values for the opening and closing of the solenoid controlled valve, the resistors being switchable by a switch.

This achieves an inexpensive and simple inspection.

The present invention (claim 6) is an invention of a vacuum pump, wherein the temperature-adjustment function unit is placed into an inspection mode when it is confirmed that the first load is short-circuited.

The temperature-adjustment function unit can be reliably placed into the inspection mode by intentionally making a short circuit.

The present invention (claim 7) is an invention of a vacuum pump, wherein the temperature-adjustment function unit and the control unit are configured as independent units.

The control unit and the temperature-adjustment function unit are separated from each other. Thus, even if the vacuum pump has a large capacity and many sensors, heaters, and solenoid controlled valves are necessary, the need for modification for largely extending a controller is eliminated, thereby suppressing the cost.

The present invention (claim 8) is an invention of a vacuum pump, further including determining means that determines one of a broken wire and a short circuit of a cable on the first terminal and the second terminal of the temperature-adjustment function unit, wherein when the determining means determines one of a broken wire and a short circuit, an input signal to the first terminal is undetected and outside of the second terminal is uncontrolled.

This can automatically set control for each terminal of the temperature-adjustment function unit, thereby preventing mistakes in settings. Moreover, an error output or erroneous control that is caused by an anomalous input signal can be prevented.

The present invention is an invention of a vacuum pump, wherein the determining means determines one of a broken wire and a short circuit at startup of the temperature-adjustment function unit.

The present invention is an invention of a temperature adjustment controller, comprising: a control unit that monitors and controls a motor and a magnetic bearing, each being stored in a pump body; and a temperature-adjustment function unit that measures a temperature of a pump body by using at least one temperature sensor disposed in the pump body and controls at least one heater or solenoid controlled valve based on the temperature, the temperature-adjustment function unit including: a first terminal capable of connecting or disconnecting the temperature sensor; and a second terminal capable of connecting or disconnecting one of the heater and the solenoid controlled valve, the temperature adjustment controller further including a self-diagnosis unit capable of conducting a self-diagnosis of whether an input signal to the first terminal has been normally inputted or whether the signal has been normally outputted from the second terminal.

The present invention is an invention of an inspection tool of a temperature-adjustment function unit that measures a temperature of a pump body by using at least one temperature sensor disposed in the pump body and controls at least one heater or solenoid controlled valve based on the temperature, the temperature-adjustment function unit including: a first terminal capable of connecting or disconnecting the temperature sensor; and a second terminal capable of connecting or disconnecting one of the heater and the solenoid controlled valve, the temperature adjustment controller further including a self-diagnosis unit capable of conducting a self-diagnosis of whether an input signal to the first terminal has been normally inputted or whether the signal has been normally outputted from the second terminal.

The present invention is an invention of a method of determining a temperature of a temperature-adjustment function unit and diagnosing the presence or absence of an anomaly of output, the temperature-adjustment function unit measuring a temperature of a pump body by at least one temperature sensor disposed in the pump body and controlling at least one heater or solenoid controlled valve based on the temperature, the temperature-adjustment function unit including: a first terminal capable of connecting or disconnecting the temperature sensor; and a second terminal capable of connecting or disconnecting one of the heater and the solenoid controlled valve, the method allowing a self-diagnosis that determines whether an input signal to the first terminal has been normally inputted or whether the signal has been normally outputted from the second terminal, wherein a dummy first load is connected instead of the temperature sensor to the first terminal, a dummy second load is connected instead of one of the heater and the solenoid controlled valve to the second terminal, the method includes: determining that the temperature sensor has reached a predetermined temperature value in simulation when a voltage applied to the first load has a preset voltage value; and applying or stopping a predetermined current to the second load based on a simulated determination result of the temperature determining means, the preset voltage value is prepared for turn-on and turn-off of the heater or opening and closing of the solenoid controlled valve, and current control on the second load is configured independently for each of the heater and the solenoid controlled valve.

As described above, the present invention (claim 1) is provided with the self-diagnosis unit that can make a self-diagnosis on whether a measured signal from the temperature sensor has been normally inputted or whether the signal has been outputted to the heater or the solenoid controlled valve, so that only the input path formed by the temperature sensor and the output path of the heater or the solenoid controlled valve are inspected. This simplifies a diagnosis program for the inspection, thereby achieving an inexpensive configuration and eliminating the need for a large inspection apparatus, e.g., a personal computer in which a dedicated program is installed.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

DESCRIPTION OF THE PREFERRED EMBODIMENTS

Figure 1:
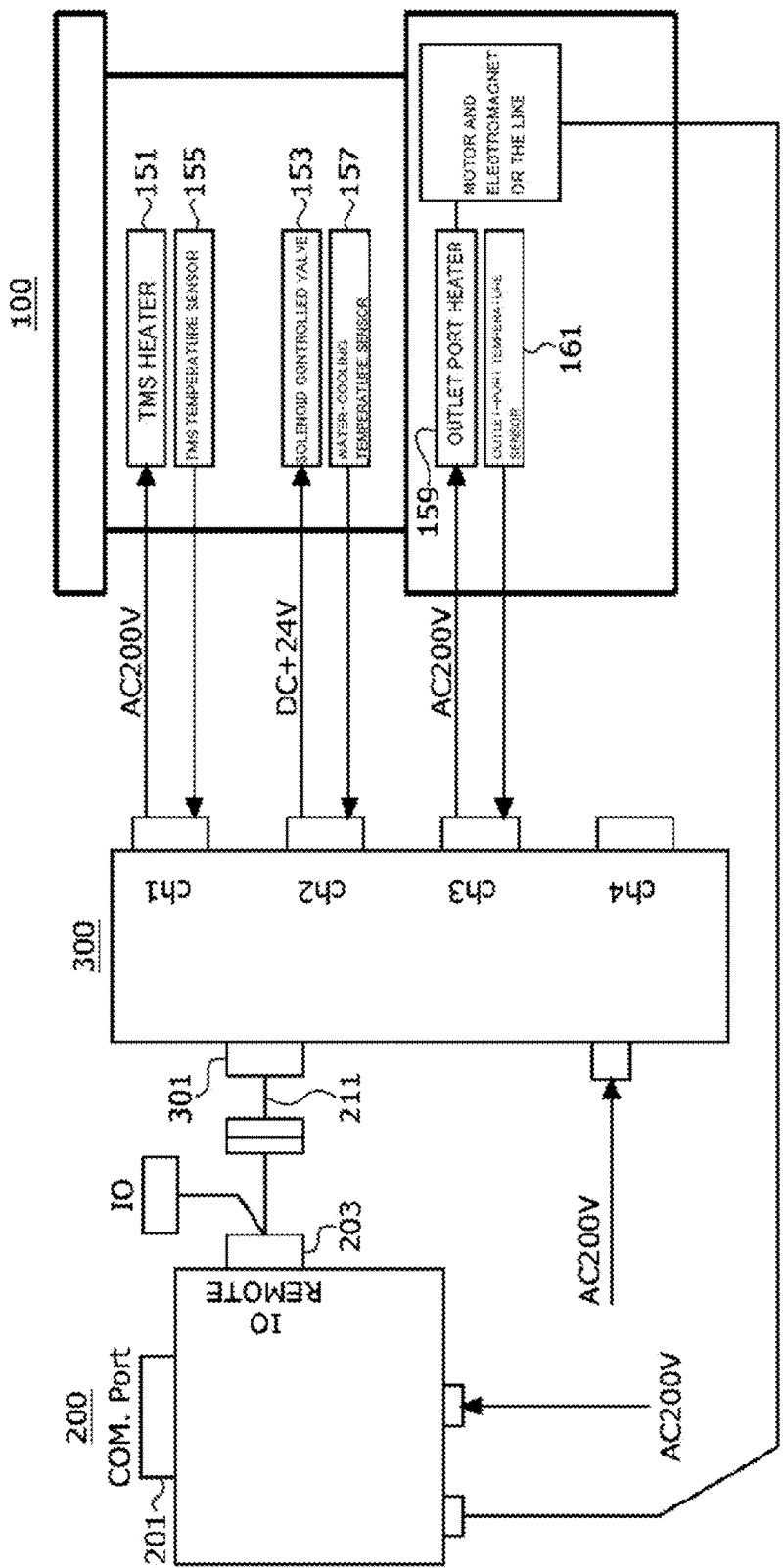
FIG. 1 is an overall system block diagram illustrating an embodiment of the present invention.
Figure 2:
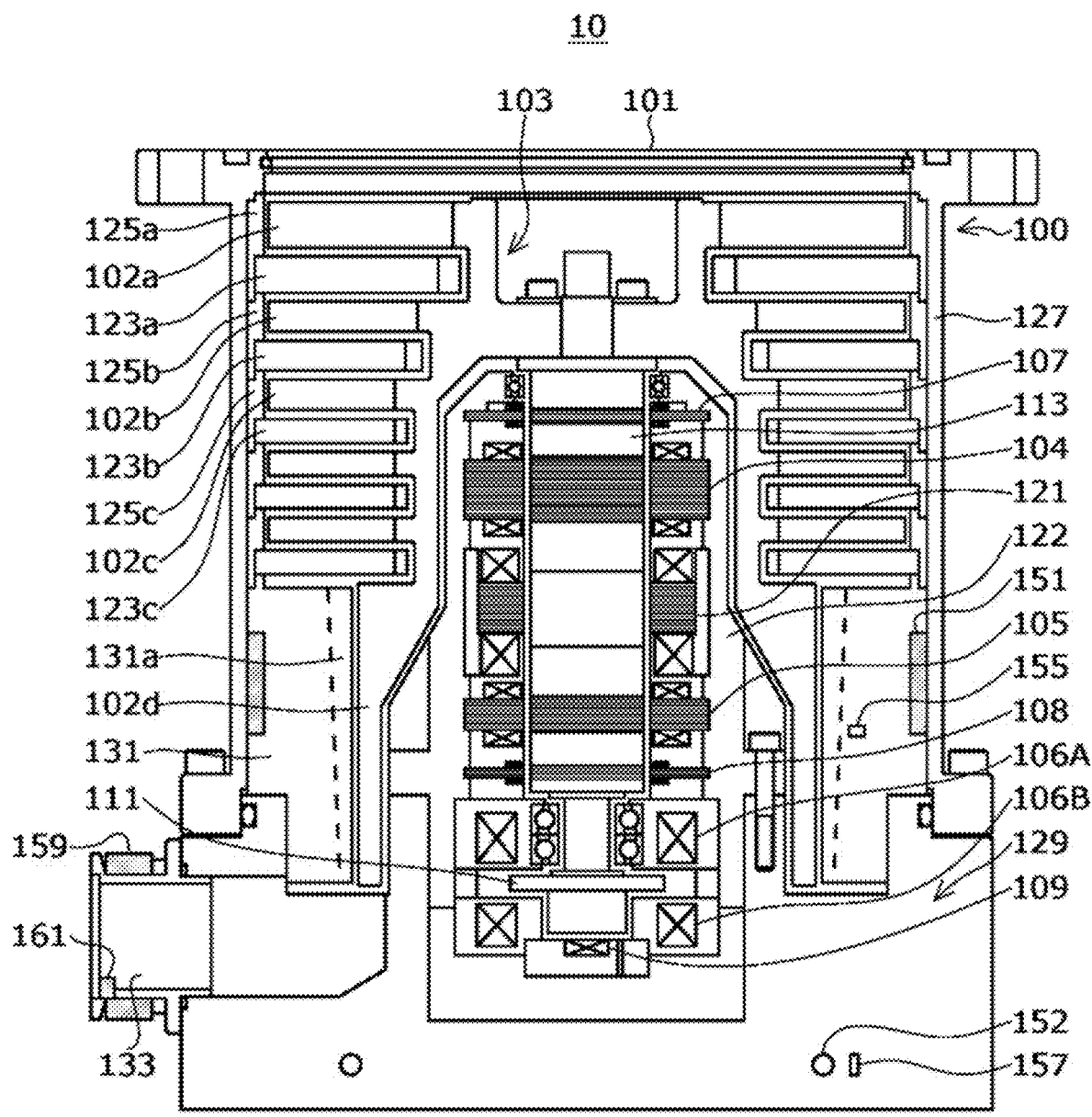
FIG. 2 is a block diagram of a turbo molecular pump.

An embodiment of the present invention will be described below. FIG. 1 is an overall system block diagram illustrating the embodiment of the present invention. FIG. 2 is a block diagram of a turbo molecular pump.

In FIG. 1, a controller 200 is separated from a pump body 100. Even if the pump body 100 and the controller 200 are combined, the turbo molecular pump is applicable to the present embodiment.

An alternating-current power supply of 200 V is supplied to the controller 200. The controller 200 monitors and controls the states of a motor 121 and magnetic bearings 104, 105, and 106 that are built into the pump body 100. The motor 121 and the magic bearings 104, 105, and 106 will be described later. An inspection tool specific for the controller 200, an I/O substrate, and a personal computer or the like can be connected to a port 201.

The controller 200 has a terminal 203 thereon and one end of a cable extension 211 is connected to the terminal 203. The other end of a cable extension 211 is connected to a terminal 301 of a TMS controller 300 that performs TMS control for temperature adjustment of the pump body 100. The alternating-current power supply of 200 V is also supplied to the TMS controller 300. The cable extension 211 may be omitted depending upon connection in the layout of the controller 200 and the TMS controller 300.

Four channels are prepared for the TMS controller 300 and each of the channels receives an input signal and outputs an output signal. In order to measure an ambient temperature raised by heat applied from a TMS heater 151, a channel 1 receives a signal inputted from a TMS sensor 155 provided near the location of the TMS heater 151. Subsequently, the alternating-current power supply of 200 V is turned on or off for the TMS heater 151 disposed in the pump body 100.

Moreover, a channel 2 receives a signal inputted from a water-cooling temperature sensor 157 that is provided near the location of a water-cooled tube 152, which will be described later, in order to measure a cooling temperature determined by opening and closing a solenoid controlled valve 153. Subsequently, the alternating-current power supply of 24 V is turned on or off for the water-cooling solenoid controlled valve 153 disposed in the pump body 100.

A channel 3 receives a signal inputted from an outlet-port temperature sensor 161 provided near the location of an outlet port heater 159. Subsequently, the alternating-current power supply of 200 V is turned on or off for the outlet port heater 159 disposed on the side of the pump body 100.

In this way, the TMS controller 300 is configured to control the single solenoid controlled valve, the two heaters, and the three temperature sensors independently from the controller 200. A channel 4 is provided as a backup channel for additional temperature control.

The number of channels is not limited to four. The number of channels is desirably set to any number according to the number of temperature controls. The number of solenoid controlled valves and heaters to be controlled is not limited. Targets of control can be switched in each of the channels by changing the settings in the channels.

Moreover, the temperature control function of the TMS controller 300 may be integrated with the controller 200.

The pump body 100 will be described below.

In FIG. 2, an inlet port 101 is formed on the upper end of a cylindrical outer casing 127 of the pump body 100. The outer casing 127 includes a rotating body 103 having a plurality of rotor blades 102a, 102b, 102c . . . that are radially and circumferentially formed in multiple stages. The rotor blades are turbine blades for sucking and exhausting gas.

A rotor shaft 113 is attached to the center of the rotating body 103. The rotor shaft 113 is supported and floated in the air by, for example, a so-called 5-axis control magnetic bearing under position control.

An upper radial electromagnet 104 includes four electromagnets that are disposed in pairs along the x axis and the y axis that are orthogonal to each other. The x axis and the y axis are the radial coordinate axes of the rotor shaft 113. An upper radial sensor 107 corresponding to the upper radial electromagnet 104 is provided with four electromagnets near the upper radial electromagnet 104. The upper radial sensor 107 is configured to detect a radial displacement of the rotor shaft 113 and transmit the displacement to the controller 200.

The controller 200 controls the excitation of the upper radial electromagnet 104 through a compensation circuit, which has a PID regulating function, based on a displacement signal detected by the upper radial sensor 107 and adjusts the upper radial position of the rotor shaft 113.

The rotor shaft 113 is made of a high-permeability material (e.g., iron) and is attracted by a magnetic force of the upper radial electromagnet 104. The adjustment is made in each of the x-axis direction and the y-axis direction.

Moreover, a lower radial electromagnet 105 and a lower radial sensor 108 are disposed like the upper radial electromagnet 104 and the upper radial sensor 107. The lower radial position of the rotor shaft 113 is adjusted as the upper radial position.

Furthermore, axial electromagnets 106A and 106B are disposed to vertically hold a disc-shaped metal disc 111 provided in the lower part of the rotor shaft 113. The metal disc 111 is made of a high-permeability material, e.g., iron. An axial sensor 109 is provided to detect an axial displacement of the rotor shaft 113 and is configured to transmit an axial displacement signal to the controller 200.

The excitation of the axial electromagnets 106A and 106B is controlled based on the axial displacement signal through the compensation circuit having the PID regulating function in the controller 200. The axial electromagnet 106A and the axial electromagnet 106B attract the metal disc 111 with a magnetic force in an upward direction and a downward direction, respectively.

In this way, the controller 200 properly regulates a magnetic force applied to the metal disc 111 by the axial electromagnets 106A and 106B, magnetically floats the rotor shaft 113 in the axial direction, and holds the rotor shaft 113 in a space in a noncontact manner.

The motor 121 has a plurality of magnetic poles circumferentially disposed around the rotor shaft 113. The magnetic poles are controlled by the controller 200 so as to rotate the rotor shaft 113 with an electromagnetic force applied between the magnetic poles and the rotor shaft 113.

A plurality of stator blades 123a, 123b, 123c . . . are disposed at small spacings between the rotor blades 102a, 102b, 102c . . . . The rotor blades 102a, 102b, 102c . . . transfer molecules of exhaust gas downward by collision and thus are formed at an inclination of a predetermined angle from a plane perpendicular to the axis of the rotor shaft 113.

The stator blades 123 are also formed at the inclination of the predetermined angle from the plane perpendicular to the axis of the rotor shaft 113. The stator blades 123 and the rotor blades 102 are alternately disposed inside the outer casing 127.

One ends of the stator blades 123 are supported while being inserted between stator blade spacers 125a, 125b, 125c . . . that are disposed in multiple stages.

The stator blade spacer 125 is a ring-shaped member that is made of, for example, metals such as aluminum, iron, stainless, and copper or metals such as an alloy of these metals.

Around the stator blade spacer 125, the outer casing 127 is fixed with a small clearance. At the bottom of the outer casing 127, a base part 129 is disposed. Between the bottom of the stator blade spacer 125 and the base part 129, a threaded spacer 131 is disposed. At the bottom of the threaded spacer 131 in the base part 129, an outlet port 133 is formed and communicates with the outside. The outlet port heater 159 is disposed around the outlet port 133. Moreover, the outlet-port temperature sensor 161 is disposed near the outlet port heater 159.

The threaded spacer 131 is a cylindrical member that is made of, for example, metals such as aluminum, copper, stainless, and iron or an alloy of these metals. A plurality of spiral thread grooves 131a are formed on the inner surface of the threaded spacer 131.

The spiral direction of the thread groove 131a is a direction along which molecules of exhaust gas are transferred to the outlet port 133 when the molecules move in the rotation direction of the rotating body 103.

A cylindrical part 102d is hung from the lowermost part of the rotating body 103, the lowermost part being continued from the rotor blades 102a, 102h, 102c . . . . The cylindrical part 102d has a cylindrical outer surface that projects toward the inner surface of the threaded spacer 131 and is placed close to the inner surface of the threaded spacer 131 with a predetermined clearance. The TMS heater 151 is disposed on the threaded spacer 131. Moreover, the TMS temperature sensor 155 is embedded in the threaded spacer 131. In the present embodiment, the threaded spacer 131 is directly heated. The threaded spacer 131 may be indirectly heated by applying heat to the base part 129.

The base part 129 is a disc-shaped member that constitutes the base of the turbo molecular pump 10 and is typically made of metals such as iron, aluminum, and stainless. Moreover, the water-cooled tube 152 is annularly embedded in the base part 129. Moreover, the water-cooling temperature sensor 157 is disposed on the side of the water-cooled tube 152.

The base part 129 physically holds the turbo molecular pump 10 and has the function of a heat conduction path and thus is desirably made of metals such as iron, aluminum, and copper that have rigidity and high thermal conductivity.

In this configuration, when the rotor blades 102 are driven by the motor 121 and rotate with the rotor shaft 113, exhaust gas is sucked from a chamber through the inlet port 101 by the actions of the rotor blades 102 and the stator blades 123.

Exhaust gas sucked from the inlet port 101 passes between the rotor blades 102 and the stator blades 123 and then is transferred to the base part 129. At this point, the temperature of the rotor blades 102 is increased by the conduction and radiation of heat generated by the motor 121 or frictional heat generated when exhaust gas comes into contact with or collides with the rotor blades 102. The heat is transferred to the stator blades 123 by radiation or conduction with the gas molecules of exhaust gas.

The stator blade spacers 125 are bonded to each other on the outer edges. Heat transferred to the outer casing 127 and the threaded spacers 131 is heat received by the stator blades 123 from the rotor blades 102 or frictional heat generated when exhaust gas comes into contact with or collides with the stator blades 123.

Exhaust gas transferred to the threaded spacers 131 is conveyed to the outlet port 133 while being guided by the thread grooves 131a.

The TMS controller 300 will be described below.

The TMS controller 300 is an apparatus having the function of adjusting the temperature of the pump body 100.

Figure 3:
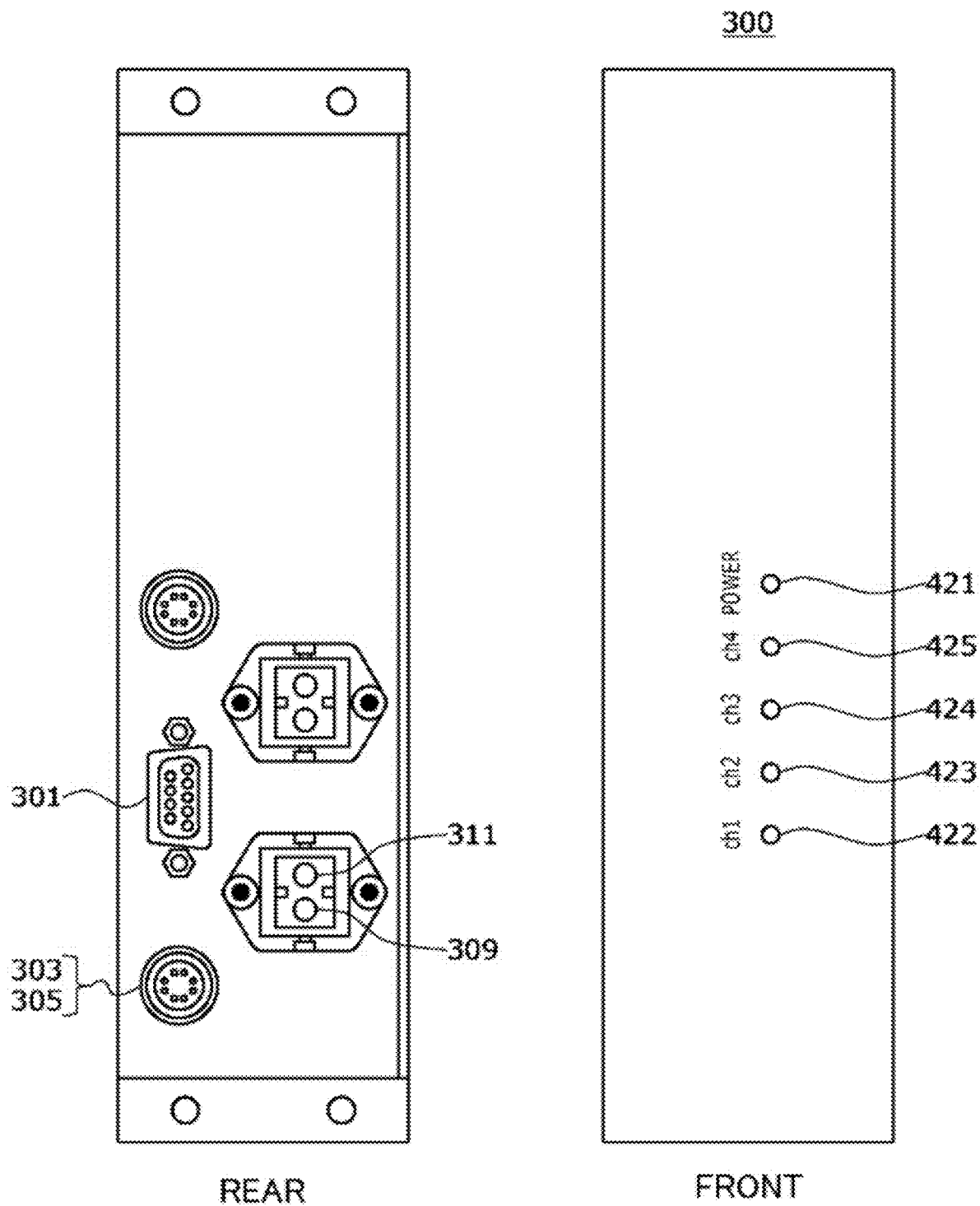
FIG. 3 illustrates a state of the front side and rear side of the cabinet of a TMS controller.

For explaining the function, FIG. 3 illustrates the front side and rear side of a cabinet. During a normal operation, the rear side of the TMS controller 300 is connected to terminals for the TMS temperature sensor 155, the water-cooling temperature sensor 157, and the outlet-port temperature sensor 161 in addition to terminals for the TMS heater 151, the outlet port heater 159, and the solenoid controlled valve 153. During an inspection of the temperature adjustment function, the terminals for the heaters, the solenoid controlled valve, and the sensors are disconnected from the rear side. Subsequently, terminals for inspection dummy circuits for the heaters, the solenoid controlled valve, and the sensors are connected instead of the disconnected terminals. The dummy circuits are all stored in an inspection tool 400.

The inspection tool 400 does not require an external inspection apparatus and enables a diagnosis of an anomaly of an input/output path in the temperature adjustment function.

Figure 4:
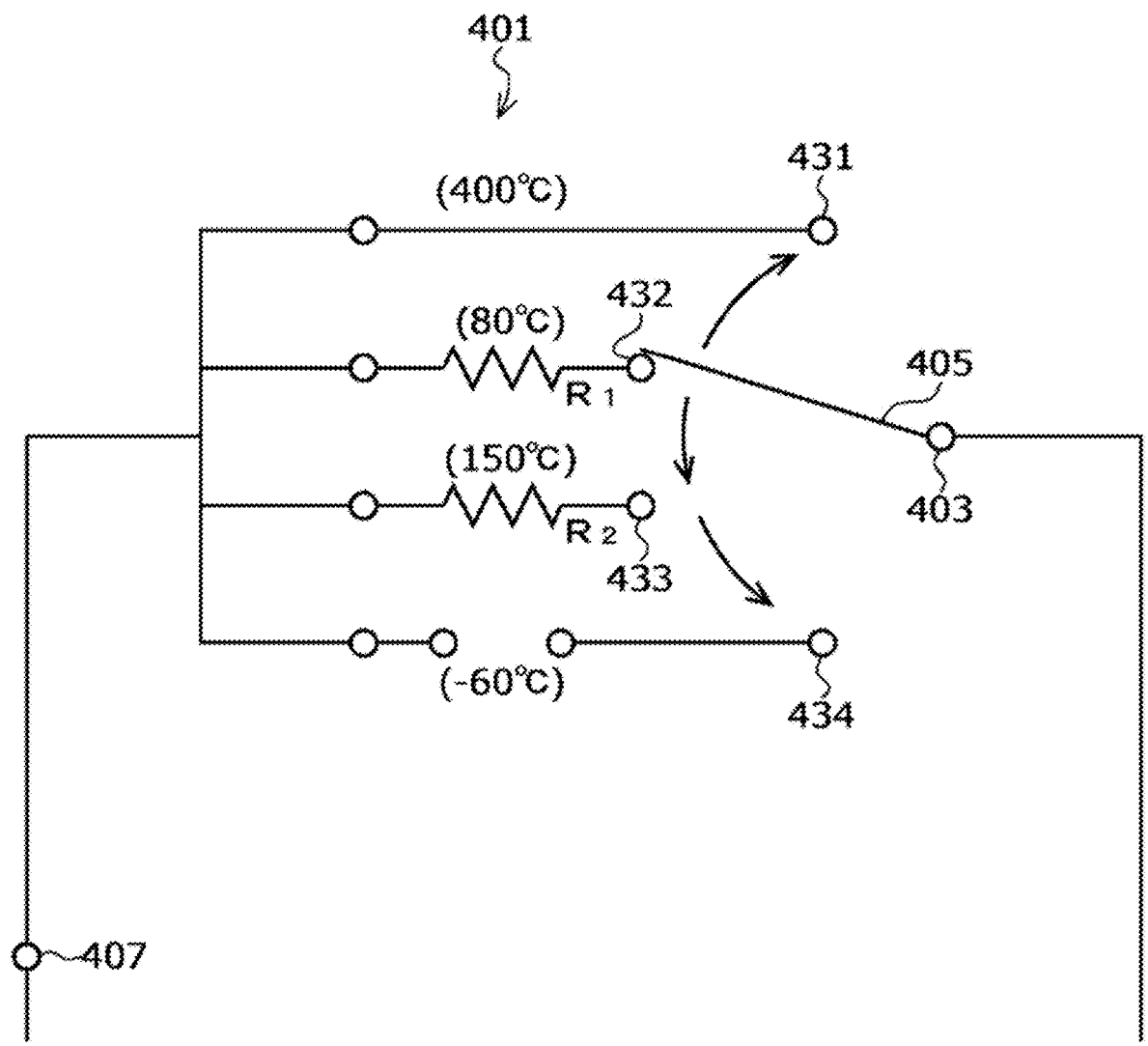
FIG. 4 is a conceptual diagram of a rotary switch.

In the inspection tool 400, a rotary switch 401 illustrated in FIG. 4 is disposed. In the rotary switch 401, an operating shaft 405 pivots about a common terminal 403 so as to switch connection from a contact 431 and a contact 434.

When the operating shaft 405 comes into contact with the contact 431, a short circuit occurs between the common terminal 403 and a terminal 407. When the operating shaft 405 comes into contact with a contact 432, a fixed resistor R1 is connected between the common terminal 403 and the terminal 407. When the operating shaft 405 comes into contact with a contact 433, a fixed resistor R2 is connected between the common terminal 403 and the terminal 407. When the operating shaft 405 comes into contact with the contact 434, a state between the common terminal 403 and the terminal 407 is opened.

Figure 5:
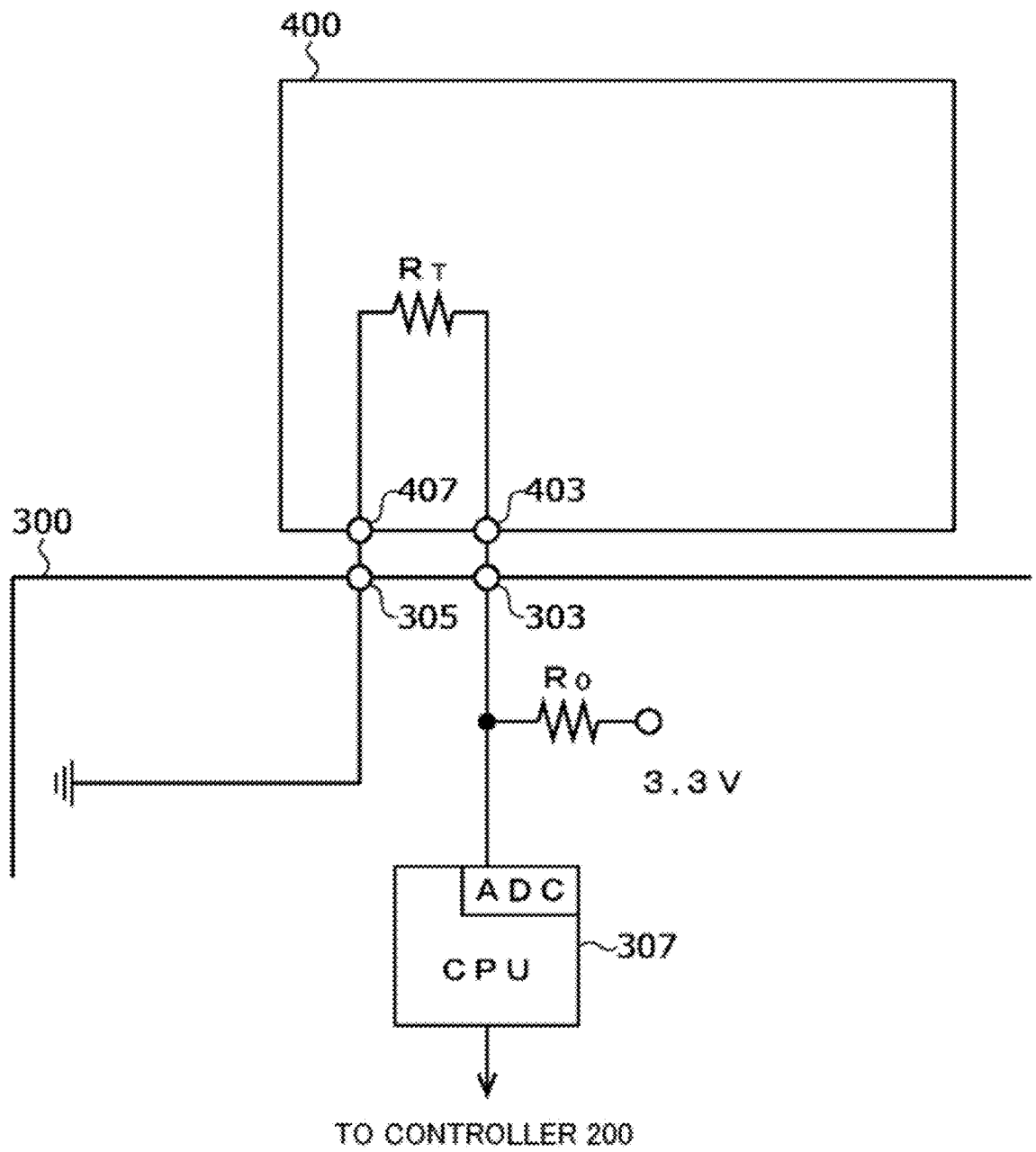
FIG. 5 is an explanatory drawing of a method of determining an input by using a resistor as a dummy of a thermistor.

As illustrated in FIG. 5, the common terminal 403 and the terminal 407 of the inspection tool 400 can be respectively connected to the terminal 303 and the terminal 305 of the TMS controller 300 during an inspection. The terminal 305 is grounded and the terminal 303 is connected to a direct-current power supply of 3.3 V via a resistor $R_0$. The voltage of the terminal 303 is converted from analog to digital and then is inputted to the CPU 307. In FIG. 5, a resistor $R_T$ simply represents the fixed resistor R1 and the fixed resistor R2 and corresponds to the dummy resistor of a thermistor. In other words, resistor $R_T$ simulates, as a resistance, a temperature of the thermistor mounted in the pump body 100.

Figure 6:
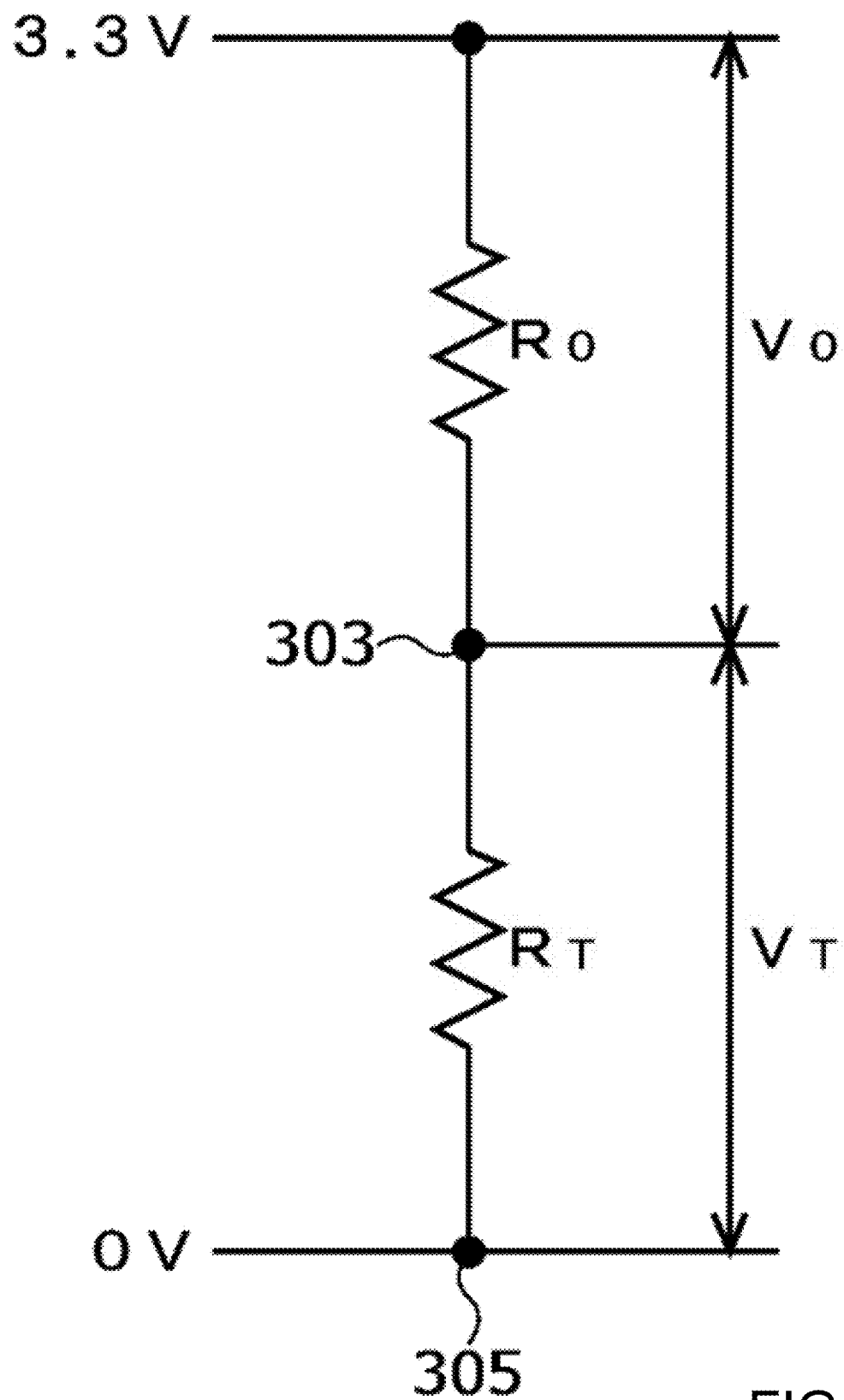
FIG. 6 illustrates a method of detecting a temperature according to a voltage generated in a dummy resistor (1)
Figure 7:
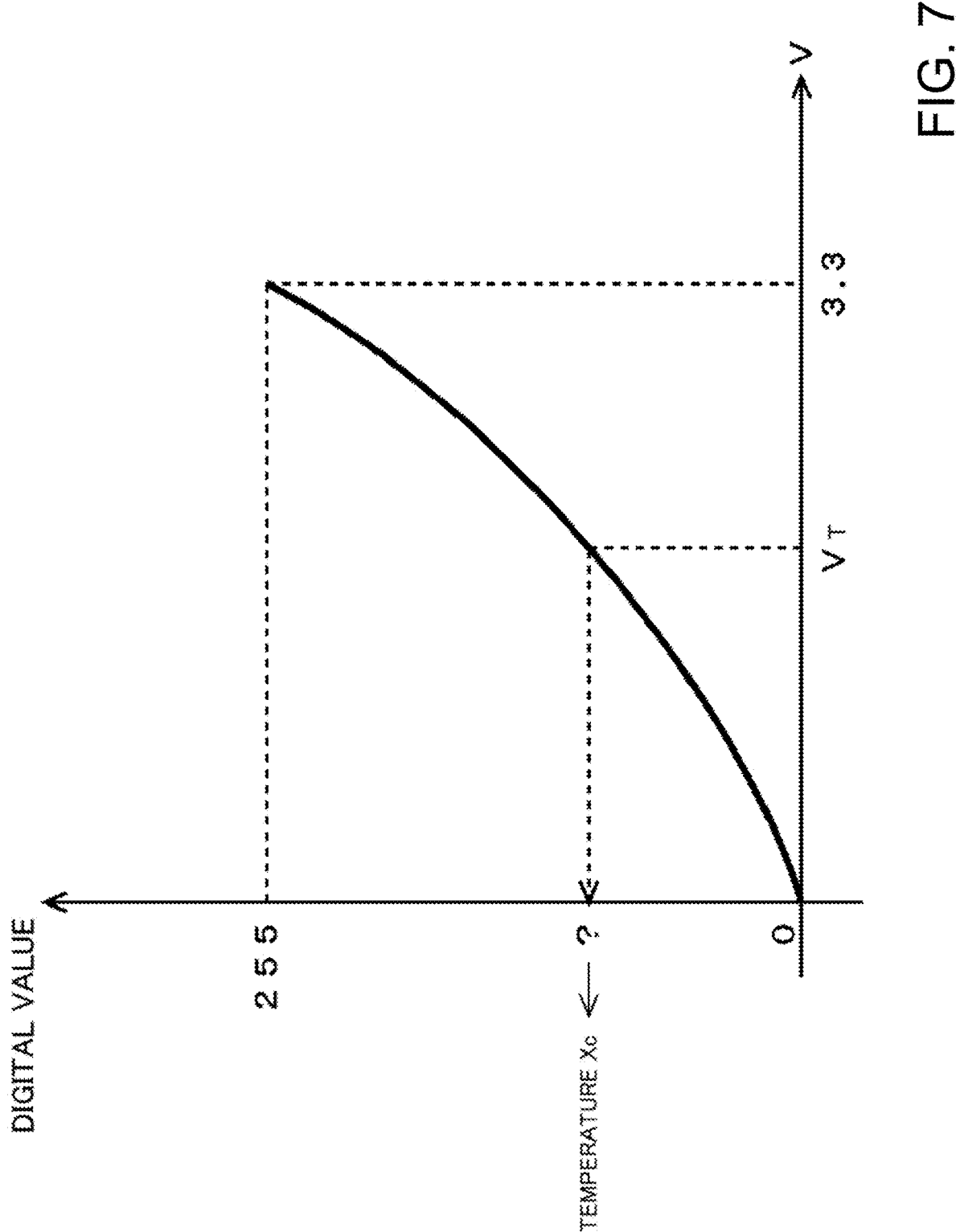
FIG. 7 illustrates a method of detecting a temperature according to a voltage generated in the dummy resistor (2)

A thermistor typically changes a resistance value with a temperature and thus determines a temperature according to a resistance value. Thus, a voltage across the resistor $R_T$ is measured as indicated by an equivalent circuit in FIG. 6 and a temperature value can be read by reading a code that is digitally converted from the voltage value as shown in FIG. 7. Since the resistor $R_0$ and the power supply of 3.3 V are kept from an operation, a temperature measured by the thermistor is replaced with the resistance value of the thermistor in simulation, thereby achieving the same status as in the measurement of the temperature by the thermistor on a trial basis.

For example, the fixed resistor R1 of FIG. 4 corresponds to 80° C. that is the lower temperature limit of TMS control when the TMS heater 151 is turned on. The fixed resistor R2 is set to be equivalent to 150° C. that is the upper temperature limit of TMS control when the TMS heater 151 is turned off. Moreover, a short-circuited state corresponds to 400° C. in the temperature characteristics of the thermistor (not illustrated) and an opened state corresponds to −60° C. An assumed temperature determined by the dummy resistor is not limited to the above temperature and is desirably set according to a set temperature for driving the TMS heater and the solenoid controlled valve.

The operations of the embodiment of the present invention will be described below.

Figure 8:
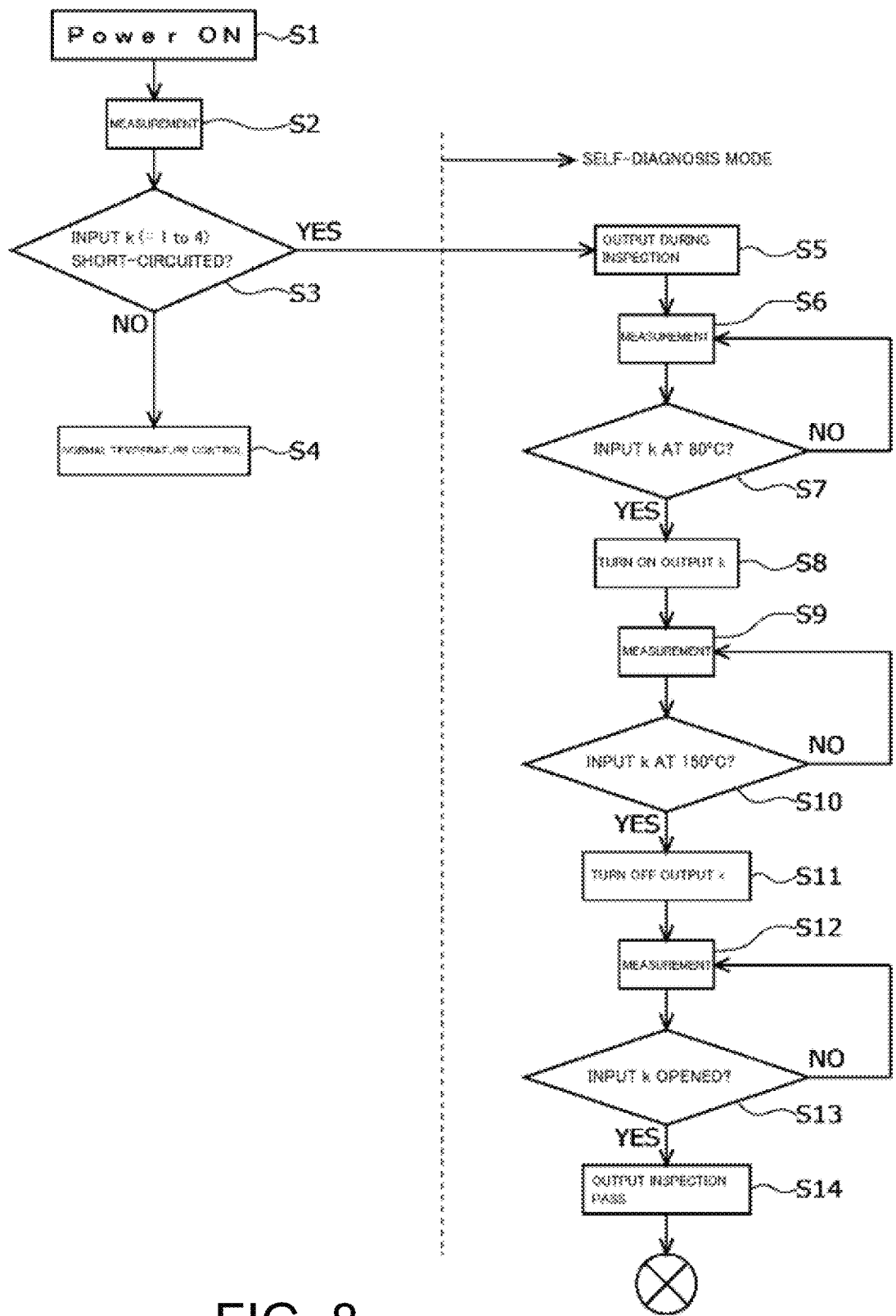
FIG. 8 is a flowchart for explaining the operations of the embodiment of the present invention.

FIG. 8 is a flowchart for explaining the operations of the embodiment of the present invention.

First, in step 1 (hereinafter, will be referred to as S1 as in FIG. 8), the power switch of the TMS controller 300 is turned on. In step 2, a measurement is started. In step 3, it is determined whether a short circuit has occurred between the terminal 303 and the terminal 305 that are illustrated in FIG. 5. Except when the inspection tool 400 is connected to the TMS controller 300 and the operating shaft 405 is in contact with the contact 431 in the rotary switch 401, the process advances to a mode in step 4 in which normal TMS temperature control is performed by software stored in the TMS controller 300. In other words, if the inspection tool 400 is not connected to the TMS controller 300, the process advances to the mode in step 4 in which normal TMS temperature control is performed by the software.

If the operating shaft 405 is in contact with the contact 431 and a short circuit occurs between the terminal 303 and the terminal 305, the process advances to a self-diagnosis mode in step 5 or later, running an inspection program independent from a normal temperature control program. The inspection program is also stored in the TMS controller 300. In order to indicate that the TMS controller 300 is being inspected, for example, a power LED 421 on the front side of the TMS controller 300 in FIG. 3 is caused to flash. During an inspection, the inspection program continuously monitors a voltage between the terminal 303 and the terminal 305.

Subsequently, the rotary switch 401 of the inspection tool 400 is switched to the contact 432. In step 6, a measurement is conducted and the inspection program detects, for example, the fixed resistor R1, which corresponds to the TMS temperature sensor 155, with a converted voltage value. In step 7, it is determined whether a pseudo-temperature is 80° C. or not based on the voltage value. If a pseudo-temperature of 80° C. is detected, the process advances to subsequent step 8 and a simulated output that corresponds to the turn-on of the TMS heater 151 is produced between the terminal 309 and the terminal 311 of the TMS controller 300 in FIG. 9.

Figure 9:
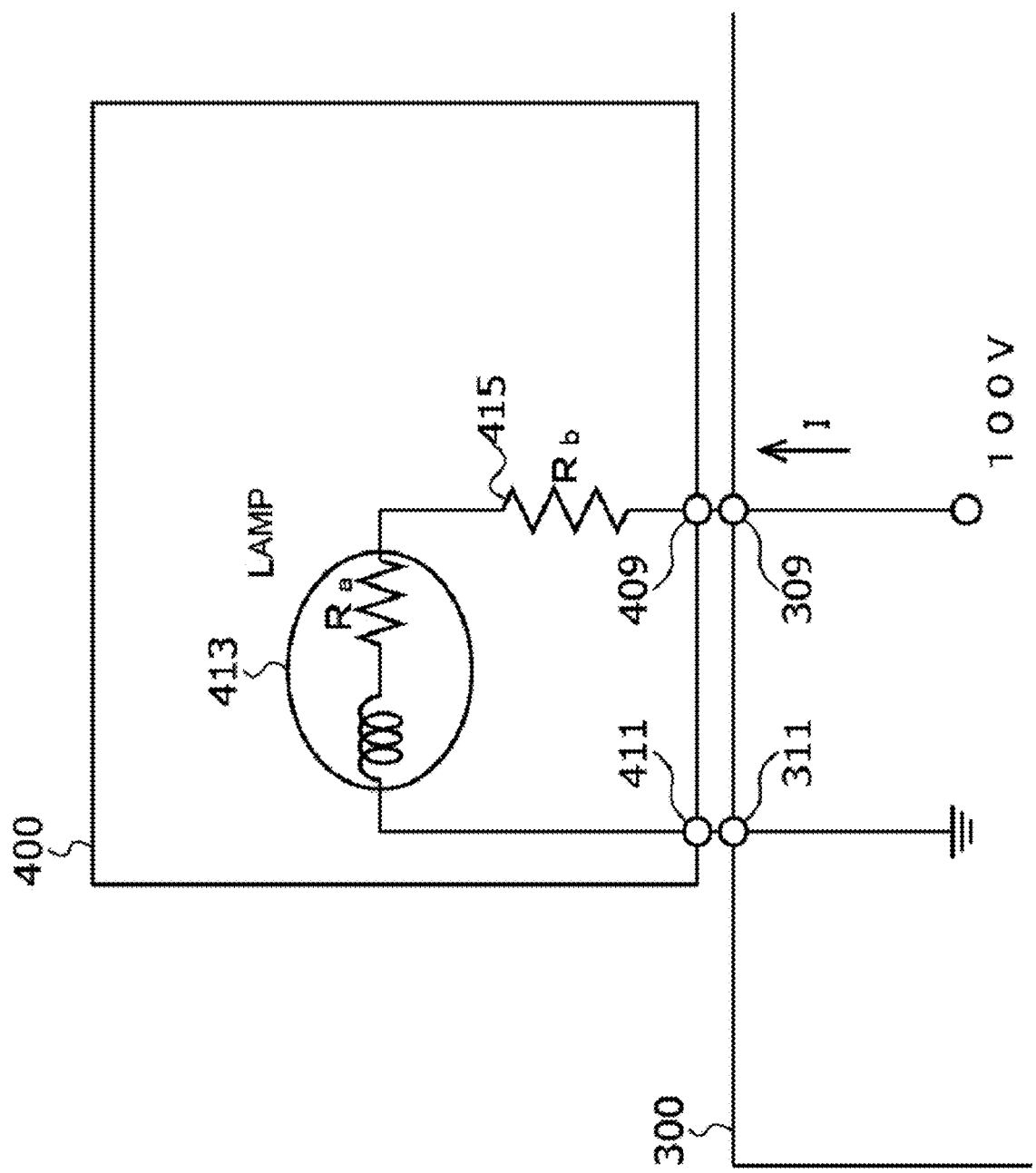
FIG. 9 is an explanatory drawing for explaining a simulated output determination method for a heater and a solenoid controlled valve.

In FIG. 9, a lamp 413 and a fixed resistor 415 are connected in series between a terminal 409 and a terminal 411 of the inspection tool 400. In this structure, the lamp 413 illuminates only when a current having at least a predetermined current value is applied. The terminal 311 of the TMS controller 300 connected to the terminal 411 is grounded. The terminal 409 and the terminal 309 of the TMS controller 300 are connected to each other. In step 8, a current required for turning on the TMS heater 151 is applied from the terminal 309. This illuminates the lamp 413 disposed in the inspection tool 400 and thus it can be determined that the TMS heater 151 is turned on in simulation. In this explanation, the lamp 413 is disposed. A current meter or the like may be disposed instead.

Subsequently, the rotary switch 401 of the inspection tool 400 is switched to the contact 433. In step 9, a measurement is conducted and the inspection program detects the fixed resistor R2, which corresponds to the TMS temperature sensor 155, with a converted voltage value. In step 10, it is determined whether a pseudo-temperature is 150° C. or not based on the voltage value. If a pseudo-temperature of 150° C. is detected, the process advances to subsequent step 11 and an output current passing between the terminal 309 and the terminal 311 of the TMS controller 300 is interrupted. At this point, the lamp 413 is turned off and thus it can be determined that the TMS heater 151 is turned off in simulation.

Subsequently, in a measurement in step 12, if an opened state is detected by switching the rotary switch 401 to the contact 434 in step 13, it is determined in step 14 that the series of inspections is passed. In step 14, an LED lamp 422 disposed on the front side of the TMS controller 300 in FIG. 3 is illuminated to indicate that the series of input inspections and output inspections on the TMS temperature sensor 155 and the TMS heater 151 is passed.

In other words, the rotary switch 401 is switched in the order of a short-circuit at the contact 431, a state of 80° C. at the contact 432, a state of 150° C. at the contact 433, and an opened stale at the contact 434. The inspections fail to be passed unless it is confirmed that the inspections are passed in this order.

A combination of the outlet-port temperature sensor 161 and the outlet port heater 159 can be similarly inspected by the program of the self-diagnosis mode. In this case, the TMS temperature sensor 155 and the TMS heater 151 have different operating temperatures and thus the resistance value of the fixed resistor R1 and the resistance value of the fixed resistor R2 are changed to resistance values for inspecting the outlet-port temperature sensor 161 and the outlet port heater 159. The LED lamp 423 disposed on the front side of the TMS controller 300 is illuminated to indicate that the combination of the outlet-port temperature sensor 161 and the outlet port heater 159 is passed.

A combination of the water-cooling temperature sensor 157 and the solenoid controlled valve 153 is similarly inspected. The resistance value of the fixed resistor R1 and the resistance value of the fixed resistor R2 may be changed to resistance values for inspecting the water-cooling temperature sensor 157 and the solenoid controlled valve 153. In this case, the LED lamp 424 disposed on the front side of the TMS controller 300 is illuminated to indicate that the combination is passed. In this way, one-to-one correspondence is established between the outputs of the sensor and the heater or the solenoid controlled valve and the combinations are independent from each other. Thus, the program of the self-diagnosis mode can run independently in multiple patterns.

At the end of the self-diagnosis mode, the TMS controller 300 is turned off.

Processing from step 5 to step 14 in the self-diagnosis mode may be optionally omitted.

For example, at the time of switching to the contact 431 to enter the self-diagnosis mode in step 5, it is determined that the pseudo-temperature is 400° C., and the output is turned off at the same time. Thus, the processing of step 9 to step 11 can be simultaneously performed, thereby reducing the steps of the self-diagnosis mode. For the inspection tool 400, the fixed resistor R2, the contact 433, and components such as the lamp 413 can be omitted, so that the inspection tool 400 can be simplified.

Inspection equipment with the temperature-adjustment function unit of the related art does not have the self-diagnosis mode of the present embodiment. In the flow of inspection for checking whether ordinary temperature control is normally performed by software, an overall system check is performed so as to include the inspections of the input/output functions of the sensor and the heater or the solenoid controlled valve.

However, a logic and software for temperature control are sufficiently evaluated only by a check in the development and problems about the program are quite unlikely to arise thereafter. Thus, it is only necessary to check for an anomaly in the part of the input/output path mainly composed of the hardware of the sensor and the heater or the solenoid controlled valve.

Thus, a self-diagnosis function for inspecting only the input/output path in the temperature-adjustment function unit of the present embodiment is incorporated into the TMS controller 300 in addition to an ordinary temperature control program.

The temperature control program and the self-diagnosis function may be integrated into the controller 200 that controls the motor 121 and the magnetic bearing.

The TMS controller 300 and the controller 200 are separately configured in the present embodiment, so that the controller 200 and the inspection tool 400 can be shared regardless of the capacity of the turbo molecular pump. Thus, the TMS controller 300 may be disposed only if the turbo molecular pump has a large capacity and many temperature adjustment sensors, heaters, and solenoid controlled valves are necessary.

In other words, even if the turbo molecular pump has a large capacity, the TMS controller 300 having only the temperature adjustment function is added to the controller 200 used in a conventional model, enabling an extension. An inspection at this point can be conducted with a simple apparatus that only connects the inspection tool 400. Moreover, the self-diagnosis program for an inspection of the input/output path of the sensor and the heater or the solenoid controlled valve is simplified. In this way, whether the input/output path is normal or not can be easily determined by a simple tool and a detection circuit in the TMS controller 300.

Thus, even if the turbo molecular pump has a large capacity and many sensors, heaters, and solenoid controlled valves are necessary, the need for modification for largely extending the controller 200 is eliminated, thereby suppressing the cost. Furthermore, it is not necessary to prepare an external inspection apparatus when a new model of the turbo molecular pump is developed. This can reduce the number of equivalent items at the start of the production of a new model.

The inspection tool 400 for inspecting the TMS controller 300 has a simple configuration at low cost and eliminates the need for a large inspection tool, e.g., a personal computer in which a dedicated program is installed. Thus, the inspection tool 400 can be easily introduced at service locations.

Since a personal computer is not necessary for inspecting the temperature adjustment function, an upgrade of an OS does not cause the obsolescence of application software unlike in the related art.

However, an operation of the temperature adjustment function can be confirmed by a personal computer if the personal computer is connected via an I/O device by using the cable extension 211 connected to the terminal 301 of the TMS controller 300 illustrated in FIG. 1.

A function of enabling a safer pump operation in the general purpose use of the TMS controller 300 will be described below.

If the TMS controller 300 is operated for general purpose use, a channel to be used and a channel not to be used need settings according to the specifications of the turbo molecular pump, for example, the operating condition and the capacity of the turbo molecular pump as will be described below.

For example, in the case of the TMS controller 300 in FIG. 1, the channels 1 to 3 are connected to the temperature sensor and the heater or the solenoid controlled valve, whereas the channel 4 is unconnected. At this point, if the setting of the unused channel 4 is not reset, an anomalous input signal generated for some reason in the TMS controller 300 after the start of a pump operation may lead to an anomalous signal outputted to the outside. If the setting is manually reset, the channel may be forgotten to be set.

Figure 10:
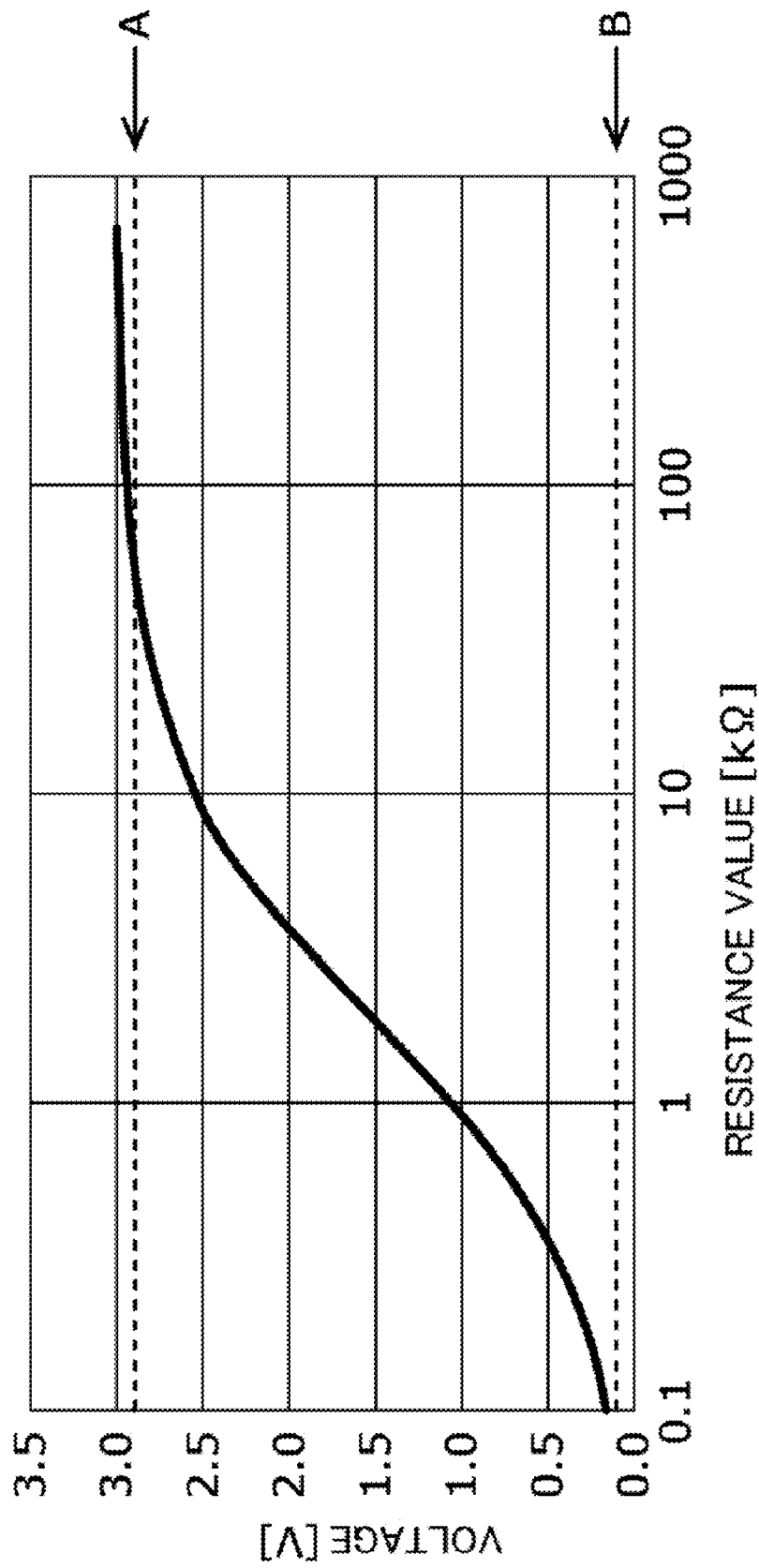
FIG. 10 is an image of the relationship between a thermistor resistance and a measured voltage.
Figure 11:
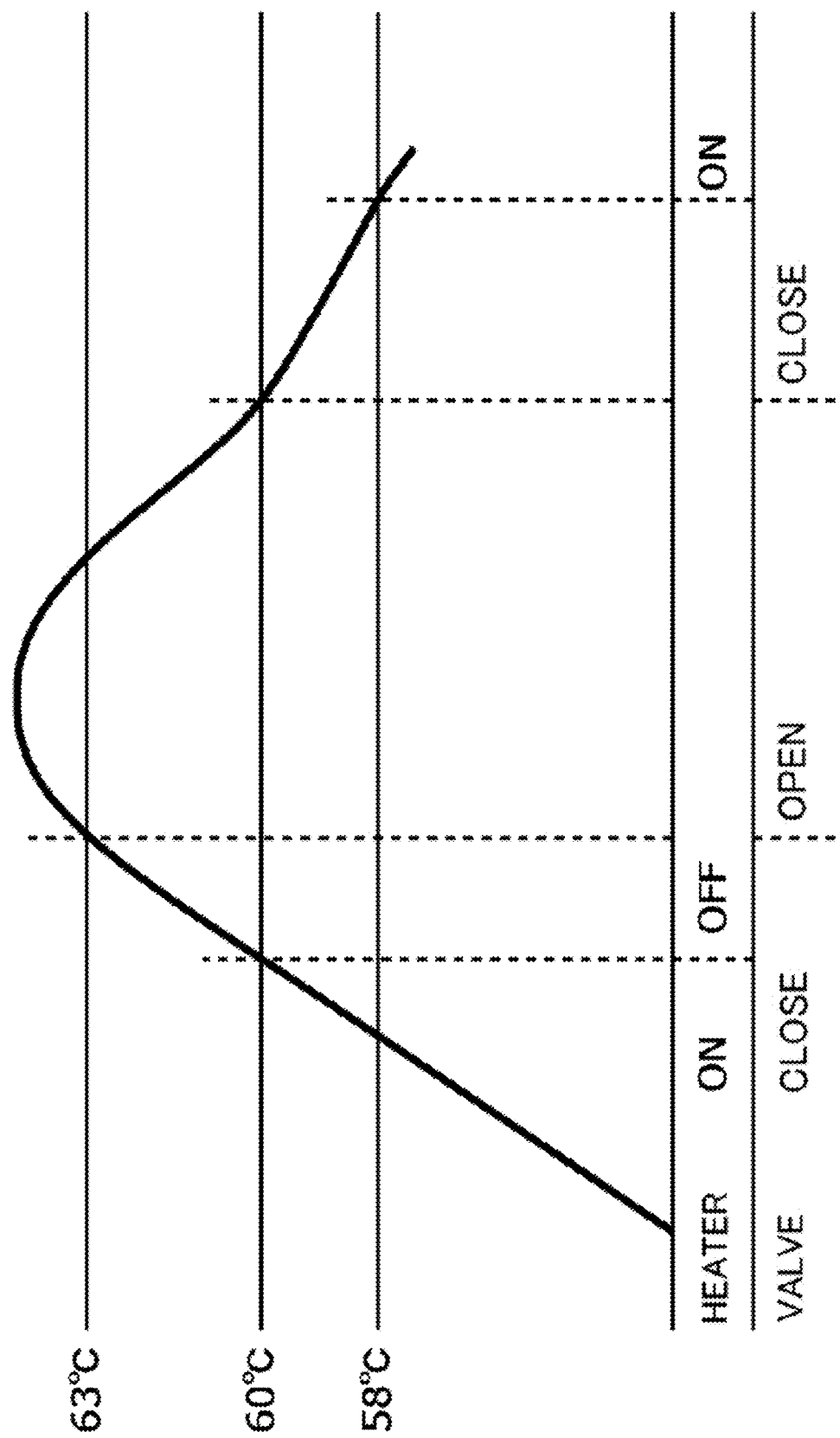
FIG. 11 indicates an example of conventional TMS control.

FIG. 10 is an image of the relationship between a thermistor resistance and a measured voltage. The measures voltage corresponds to a voltage between the terminal 303 and the terminal 305 in FIG. 5. Whether a cable is connected between the terminal 303 and the terminal 305 is determined by reading a voltage between the terminal 303 and the terminal 305 at startup. Specifically, if a voltage between the terminal 303 and the terminal 305 is determined between line A (equivalent to about 2.9 V) in FIG. 10 and a power supply voltage of 3 V (in a broken-wire determination region), it is determined that a wire is broken. If the voltage is determined between line B (equivalent to about 0.1 V) in FIG. 10 and 0 V (in a short-circuit determination region), it is determined that a short circuit has occurred. If a voltage value is determined in the broken-wire determination region or the short-circuit determination region at startup, the setting of control of the channel is reset. However, the setting of the broken-wire determination region or the short-circuit determination region is desirably determined in consideration of a voltage drop or a tolerance of the circuit and the cable.

If the setting of control of the channel is reset, an anomaly of the temperature sensor is not detected after the start of a pump operation. Moreover, output device control for the heater and the solenoid controlled valve is not performed on the temperature sensor. After a broken wire or a short circuit is confirmed, an alarm may be outputted to the outside in order to indicate that the corresponding channel is disabled by a broken wire or a short circuit.

Such determination and reset can be performed on all the channels. In other words, control on the unused channel can be automatically stopped.

For example, if the cable of the outlet-port temperature sensor 161 is not connected to the channel when the specifications are changed such that the outlet port heater 159 is not used, the setting of control of the outlet port heater 159 in the TMS controller 300 is automatically reset, thereby changing the setting of control without fail.

Moreover, on the input channel having a broken wire, anomalies of the temperature sensor, for example, a broken wire, a short circuit, a low temperature, and a high temperature are not detected and thus even if an anomalous signal input is found after the start of a pump operation, an error is not displayed to the outside or erroneous control is not performed.

A broken wire and a short circuit can be determined at the startup of the TMS controller 300 (the startup of the temperature-adjustment function unit) and the setting having been temporarily reset can be made again by restarting the TMS controller 300.

As described above, the function used for the TMS controller 300 can automatically set control for each channel of the TMS controller 300, thereby preventing mistakes in settings. Moreover, an error output or erroneous control that is caused by an anomalous input signal can be prevented.

The present invention can be modified in various ways without departing from the scope of the present invention. The present invention is naturally extended to the modifications.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

What is claimed is:

1. A vacuum pump comprising:
a control unit that monitors and controls a motor and a magnetic bearing, each being stored in a pump body; and
a temperature-adjustment function unit that measures a temperature of the pump body by at least one temperature sensor disposed in the pump body and controls at least one heater or solenoid controlled valve based on the temperature,
the temperature-adjustment function unit including a first terminal capable of connecting or disconnecting the temperature sensor; and
a second terminal capable of connecting or disconnecting one of the heater and the solenoid controlled valve,
the vacuum pump further comprising a self-diagnosis unit capable of conducting a self-diagnosis of whether an input signal to the first terminal has been normally inputted or whether the signal has been normally outputted from the second terminal,
temperature determining means that has a dummy first load connected instead of the temperature sensor to the first terminal and determines that the temperature sensor has reached a predetermined temperature value in simulation when a voltage applied to the first load has a preset voltage value; and
output means that has a dummy second load connected instead of one of the heater and the solenoid controlled valve to the second terminal, and applies or stops a predetermined current to the second load based on a determination result of the temperature determining means,
the preset voltage value is prepared for turn-on and turn-off of the heater or opening and closing of the solenoid controlled valve, and
the output means is configured independently for each of the heater and the solenoid controlled valve.

2. The vacuum pump according to claim 1, wherein an inspection is judged to be passed or not by determining the turn-on and turn-off of the heater or the opening and closing of the solenoid controlled valve on a time-series basis.

3. The vacuum pump according to claim 1, wherein the first load is a resistor having resistance values for the turn-on and turn-off of the heater or a resistor having resistance values for the opening and closing of the solenoid controlled valve, the resistors being switchable by a switch.

4. The vacuum pump according to claim 1, wherein the temperature-adjustment function unit is placed into an inspection mode when it is confirmed that the first load is short-circuited.

5. The vacuum pump according to claim 1, wherein the temperature-adjustment function unit and the control unit are configured as independent units.

6. A temperature adjustment controller comprising:
a control unit that monitors and controls a motor and a magnetic bearing, each being stored in a pump body; and
a temperature-adjustment function unit that measures a temperature of a pump body by using at least one temperature sensor disposed in the pump body and controls at least one heater or solenoid controlled valve based on the temperature,
the temperature-adjustment function unit including:
a first terminal capable of connecting or disconnecting the temperature sensor; and
a second terminal capable of connecting or disconnecting one of the heater and the solenoid controlled valve,
the temperature adjustment controller further comprising a self-diagnosis unit capable of conducting a self-diagnosis of whether an input signal to the first terminal has been normally inputted or whether the signal has been normally outputted from the second terminal,
temperature determining means that has a dummy first load connected instead of the temperature sensor to the first terminal and determines that the temperature sensor has reached a predetermined temperature value in simulation when a voltage applied to the first load has a preset voltage value; and
output means that has a dummy second load connected instead of one of the heater and the solenoid controlled valve to the second terminal, and applies or stops a predetermined current to the second load based on a determination result of the temperature determining means,
the preset voltage value is prepared for turn-on and turn-off of the heater or opening and closing of the solenoid controlled valve, and
the output means is configured independently for each of the heater and the solenoid controlled valve.

7. An inspection tool of a temperature-adjustment function unit that measures a temperature of a pump body by using at least one temperature sensor disposed in the pump body and controls at least one heater or solenoid controlled valve based on the temperature,
the temperature-adjustment function unit including:
a first terminal capable of connecting or disconnecting the temperature sensor; and
a second terminal capable of connecting or disconnecting one of the heater and the solenoid controlled valve,
the temperature adjustment controller further comprising a self-diagnosis unit capable of conducting a self-diagnosis of whether an input signal to the first terminal has been normally inputted or whether the signal has been normally outputted from the second terminal,
temperature determining means that has a dummy first load connected instead of the temperature sensor to the first terminal and determines that the temperature sensor has reached a predetermined temperature value in simulation when a voltage applied to the first load has a preset voltage value; and
output means that has a dummy second load connected instead of one of the heater and the solenoid controlled valve to the second terminal, and applies or stops a predetermined current to the second load based on a determination result of the temperature determining means, the preset voltage value is prepared for turn-on and turn-off of the heater or opening and closing of the solenoid controlled valve, and the output means is configured independently for each of the heater and the solenoid controlled valve.

8. A method of determining a temperature of a temperature-adjustment function unit and diagnosing presence or absence of an anomaly of output, the temperature-adjustment function unit measuring a temperature of a pump body by at least one temperature sensor disposed in the pump body and controlling at least one heater or solenoid controlled valve based on the temperature, the temperature-adjustment function unit including:
a first terminal capable of connecting or disconnecting the temperature sensor; and
a second terminal capable of connecting or disconnecting one of the heater and the solenoid controlled valve, the method allowing a self-diagnosis that determines whether an input signal to the first terminal has been normally inputted or whether the signal has been normally outputted from the second terminal, connecting a dummy first load instead of the temperature sensor to the first terminal, connecting a dummy second load is connected instead of one of the heater and the solenoid controlled valve to the second terminal, determining that the temperature sensor has reached a predetermined temperature value in simulation when a voltage applied to the first load has a preset voltage value; and applying or stopping a predetermined current to the second load based on a simulated determination result of the temperature determining means, preparing the preset voltage value for turn-on and turn-off of the heater or opening and closing of the solenoid controlled valve, and configuring current control on the second load independently for each of the heater and the solenoid controlled valve.

\* \* \* \* \*